(12) United States Patent
Spassov

(10) Patent No.: US 11,022,945 B2
(45) Date of Patent: Jun. 1, 2021

(54) MOTHER-OF-PEARL SUBSTRATE COATED WITH A YELLOW LAYER

(71) Applicant: The Swatch Group Research and Development Ltd, Marin (CH)

(72) Inventor: Vladislav Spassov, Praz (CH)

(73) Assignee: The Swatch Group Research and Development Ltd, Marin (CH)

(*) Notice: Subject to any disclaimer, the term of this patent is extended or adjusted under 35 U.S.C. 154(b) by 614 days.

(21) Appl. No.: 15/831,453

(22) Filed: Dec. 5, 2017

(65) Prior Publication Data

US 2018/0181071 A1 Jun. 28, 2018

(30) Foreign Application Priority Data

Dec. 23, 2016 (EP) .................................... 16206568

(51) Int. Cl.
*C23C 14/06* (2006.01)
*C23C 14/02* (2006.01)
(Continued)

(52) U.S. Cl.
CPC ........ *G04B 37/223* (2013.01); *C23C 14/0015* (2013.01); *C23C 14/022* (2013.01); *C23C 14/0641* (2013.01); *C23C 14/0652* (2013.01); *C23C 14/0676* (2013.01); *C23C 14/24* (2013.01); *C23C 28/042* (2013.01); *C23C 28/044* (2013.01); *G04B 19/12* (2013.01); (Continued)

(58) Field of Classification Search
CPC . C23C 28/042; C23C 28/044; C23C 14/0015; C23C 14/022; C23C 14/0641; C23C 14/0652; C23C 14/0676; C23C 14/24; A44C 27/006; B44C 3/02; G04D 3/0069; G04D 3/0092; G04D 3/0074; G04B 37/223; G04B 19/12; G04B 45/0076; G04B 47/04
See application file for complete search history.

(56) References Cited

U.S. PATENT DOCUMENTS

2014/0037943 A1 2/2014 Cao
2015/0232978 A1* 8/2015 Schier .................. C23C 28/044
428/141

FOREIGN PATENT DOCUMENTS

EP 0 353 060 A2 1/1990
EP 0 353 060 A3 1/1990
(Continued)

OTHER PUBLICATIONS

European Search Report dated Aug. 10, 2017 in European Application 16206568.4, filed on Dec. 23, 2016 (with English Translation of Categories of cited documents).
(Continued)

*Primary Examiner* — Michael P Wieczorek
(74) *Attorney, Agent, or Firm* — Oblon, McClelland, Maier & Neustadt, L.L.P.

(57) ABSTRACT

Method for coloured coating on a watchmaking or jewellery external part component, comprising at least one visible surface prepared in advance on a substrate, this method comprising a step of vacuum-deposition of at least one main layer of titanium and silicon nitride (Ti, $Si_k$)$N_x$ or of titanium and silicon nitride doped with oxygen (Ti, $Si_k$)$N_xO_y$.

11 Claims, 1 Drawing Sheet

(51) Int. Cl.
*C23C 28/04* (2006.01)
*C23C 14/24* (2006.01)
*G04B 37/22* (2006.01)
*G04B 47/04* (2006.01)
*G04B 19/12* (2006.01)
*G04B 45/00* (2006.01)
*G04D 3/00* (2006.01)
*C23C 14/00* (2006.01)
*A44C 27/00* (2006.01)
*B44C 3/02* (2006.01)

(52) U.S. Cl.
CPC ......... *G04B 45/0076* (2013.01); *G04B 47/04* (2013.01); *G04D 3/0069* (2013.01); *G04D 3/0092* (2013.01); *A44C 27/006* (2013.01); *B44C 3/02* (2013.01); *G04D 3/0074* (2013.01)

(56) References Cited

FOREIGN PATENT DOCUMENTS

| | | |
|---|---|---|
| EP | 1 672 436 A1 | 6/2006 |
| FR | 2 425 210 A1 | 12/1979 |
| JP | 2009-213616 | 9/2009 |

OTHER PUBLICATIONS

Jindrich Musil, et al. "Ti—Si—N Films with a High Content of Si", Plasma Processes and Polymers, vol. 4, No. S1, 2007, 5 pages.
J. Pang, et al. "Deposition of Ti—Si—N films on Al substrates by magnetron sputtering", Surface Engineering, vol. 29, No. 10, 2013, 7 pages.

\* cited by examiner

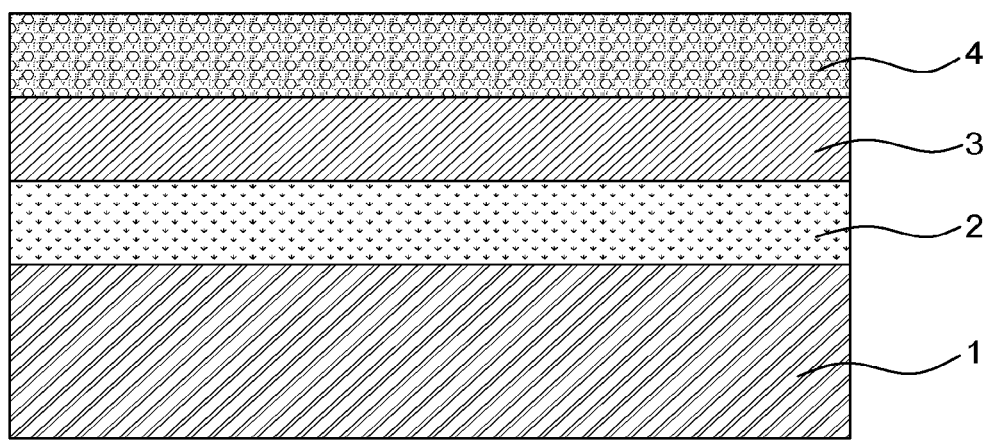

MOTHER-OF-PEARL SUBSTRATE COATED WITH A YELLOW LAYER

This application claims priority from European Patent Application No. 16206568.4 filed on Dec. 23, 2016, the entire disclosure of which is incorporated herein by reference.

FIELD OF THE INVENTION

The invention relates to a method for coloured coating on a watchmaking or jewellery component, in particular an external part component, comprising at least one visible surface prepared in advance on a substrate, said method comprising at least one vacuum-deposition step of at least one main layer of titanium and silicon nitride (Ti, $Si_k)N_x$ or of titanium and silicon nitride doped with oxygen (Ti, $Si_k)N_xO_y$.

The invention also relates to a watchmaking or jewellery structural component comprising a mother-of-pearl substrate.

The invention also relates to a watchmaking or jewellery external part component comprising a mother-of pearl substrate.

The present invention relates to the field of watchmaking and jewellery.

BACKGROUND OF THE INVENTION

The aesthetic appearance is very important in the fields of watchmaking and jewellery, and it is desirable to colour some components. There comes to mind in particular watch dials which it is desirable to colour in various shades, and, amongst others, in a pale yellow colour, hereafter termed "champagne", and evoking the colour of some great effervescent white wines, associated with a luxury image.

Use of thin inorganic layers for colouring the surfaces of timepieces is well established and used. However, most of the layers used (metal, nitrides, carbides, and others) are highly absorbent and practically opaque, just from a thickness of a few tens of nanometers. Furthermore, they greatly reflect light and therefore have a metallic appearance which is not always desired. These two characteristics greatly limit their use for colouring a surface whilst still keeping visible its original appearance, for example a pearlescent or interferential appearance, or, in the case of luxury watchmaking, a bevelled surface or one with guilloche work, and requiring to remain unpolished from machining without the least mechanical treatment of polishing, sanding or similar.

In order to arrive at this goal, it is necessary to use a layer which, at the same time:
  absorbs very selectively in the visible spectrum (this defines the colour in transmission of this layer); this allows an "intrinsic colour" which is independent of the viewing angle;
  has the lowest possible reflectance, comparable to dielectric oxides (absence of metallic appearance);
  adheres well to the substrate;
  is non-toxic;
  is stable relative to production and use conditions of the coated article, for example washing, application of appliqués, handling, and similar;
  is deposited under conditions which do not impair the substrate;
  is chemically stable and resistant to the normal tests for internal parts in watchmaking: UV, moist heat, thermal shocks, and others.

These properties are often contradictory, and it is difficult to satisfy all these conditions at the same time.

The particular case of the pale yellow colour is difficult to deal with because often the layers used are not very resistant, in particular not very resistant to abrasion. In fact, the chemical compositions which are typically used to create thin transparent layers of a yellow colour generally contain iron oxides and are not very resistant to abrasion and to chemical attacks.

Other chemical compositions which are typically used to create thin layers of a yellow colour have a very glossy sheen and are not transparent: these are in particular nitrides and carbonitrides of Ti and/or Zr, $(Ti,Zr)N_x$; $(Zr,Hf)N_x$. Even if it is conceivable to create a colour by interference, by dielectric layers, in particular $SiO_2$, or $Si_3N_4$, this technique has the enduring disadvantage which resides in the fact that the apparent colour is dependent upon the angle of observation. Furthermore, for such a type of layers, the colour in reflection is always very strong and complementary to that of transmission.

Coloration by organic pigments is also achievable but has deficiencies in long-term stability of the pigments, and low resistance to abrasion and to chemical attacks.

And it seems that to this day there is no transparent yellow layer on the market which is compatible with the above-mentioned requirements and which has very good properties of resistance to abrasion.

Document FR 2 425 210 A1 Nishida Nobuo describes jewellery components provided with a coating of a gold colour on a substrate which is insensitive to heat, the coating having a thickness of 0-1 µm, formed of titanium nitride, comprising an element from Al, Si, V, Cr, Fe, Co, Ni, Cu, Zn, Ge, Y, Zr, Nb, Mo, Ru, Rh, Pd, Ag, Cd, In, Sn, Sb, Ti, Hf, Ta, W, Ir, Pt and Au. The external surface of the coating has a spectral reflection ratio between 1.2/1-3.0/1 at 550 µm and 400 µm. The substrate can be made of steel and/or of Ni and/or of Ni—Ag, and/or an alloy, such as an alloy of Al, and/or a ceramic substance, and/or a resin resistant to heat. For watch cases, straps and rings. The colour of the coating closely resembles gold and the method is economical.

Document EP 0 353 060 A2 NIPPON STEEL describes a metallic plate doped with an excellent decorative colour by a multilayer coating made of a layer of coloured ceramic layer formed on the metal plate, the coloured ceramic layer being formed by at least one compound chosen from the nitrides and carbides of titanium, zirconium, hafnium, chromium, niobium and aluminium and having a thickness of 0.1 µm to 1 µm; and a transparent ceramic layer formed on the coloured ceramic layer, the transparent ceramic layer being made of at least one of the group consisting of silicon oxide, silicon nitride and aluminium oxide and having a thickness of 0.1 µm to 5 µm. Deposition of the coloured and transparent ceramic layers is effected by a dry method, and the order of deposition of the coloured and transparent ceramic layers can be inverted.

Document US 2014/037943 A1 Cao Da-Hua describes a coated article comprising a metallic substrate, a TiSiN layer formed directly on the metallic substrate, the TiSiN layer consisting essentially of elementary Ti, Si and elementary N, the elementary Si in the TiSiN layer having a percentage by mass which decreases progressively from the bottom of the TiSiN layer near the substrate to the upper part of the TiSiN layer at a remove from the substrate, the elementary N having a percentage by mass by increasing progressively from the bottom of the TiSiN layer near the substrate to the upper part of the TiSiN layer at a remove from the substrate;

and a layer of TiN formed directly on the TiSiN layer, the TiN layer being formed essentially of elementary Ti and elementary N.

Document JP 2009 213616 A CITIZEN describes a rigid layer comprising a nitride layer as in the invention but also a finishing layer comprising gold or a gold alloy, under a transparent superficial layer.

Document EP 1 672 436 A1 ROLEX describes a method for manufacture of a dial for a timepiece, the visible surface of which comprises a metallic-look coating, the surface state of which has a morphology characteristic of that of mother-of-pearl, characterised in that a mother-of-pearl plate is subjected to a sanding operation in order to give it a surface state corresponding to the morphology of this mother-of-pearl, this surface is cleaned and coated with a metallic layer or one made of oxide, nitride or metallic carbide.

The article by Jindrich Musil et al., published on 1 Apr. 2007, relates to "Ti—Si—N films with a high content of Si", Plasma processes and polymers, vol. 4, no.S1, pages S574-578, XP055397274, ISSN 1612-8850, DOI 10.2012/ppap.200731408.

The article by J. Pang & al., published on 1 Nov. 2013, relates to "deposition of Ti—Si—N films on Al substrates by magnetron sputtering", Surface engineering, vol. 29, no.10, pages 749-754, XP055397272, ISSN 0267-0844, DOI 10.1179/1743294413Y.0000000178.

SUMMARY OF THE INVENTION

The invention proposes to give a yellow "champagne" appearance to watchmaking or jewellery structural or external part components, in particular mother-of-pearl components, such as dials or similar, whilst keeping the original surface of these parts visible.

To this end, the invention relates to a method for coloured coating on a watchmaking or jewellery structural component or an external part component according to claim 1.

The invention also relates to a watchmaking or jewellery structural component comprising a mother-of-pearl substrate.

The invention also relates to a watchmaking or jewellery external part component comprising a mother-of-pearl substrate.

According to the invention, the coloration is achieved by at least one non-opaque main layer which is intrinsically yellow in transmission and transparent. This coloration is based on titanium and silicon nitride $(Ti, Si_k)N_x$ or titanium and silicon nitride doped with oxygen $(Ti, Si_k)N_xO_y$, which, thanks to its transparency, does not conceal the visual effects intrinsic to the surface below the coating, which can in particular arise from brushing, guilloche work, or others, which are able to produce a particular relief effect, or a pearlescent appearance, or interferential effects, or other.

The layer is vacuum-deposited, for example by Physical Vapour Deposition using cathodic (sputter-PVD) or ionic (ion-beam-PVD) sputtering, evaporation (evaporation-PVD), ablation by laser (Pulsed Laser Deposition PVD), or other similar process.

This new coloration process is particularly well adapted for a mother-of-pearl substrate.

This method allows deposition of a yellow layer, which is transparent, and more particularly with a golden sheen, whilst having sufficient colouring power in a thin layer.

The layer of the titanium and silicon nitride base $(Ti, Si_k)N_x$ or titanium and silicon nitride base doped with oxygen $(Ti, Si_k)N_xO_y$ according to the invention is very resistant to abrasion and to chemical attacks, and is biocompatible. These properties make this layer compatible with the requirements for the external parts.

BRIEF DESCRIPTION OF THE DRAWINGS

Other features and advantages of the invention will appear upon reading the detailed description which will follow, with reference to the annexed drawings, where FIG. 1 represents, schematically and in section, a timepiece or jewellery external part component, produced by a method according to the invention, in a particular and non-limiting variant, comprising a stack of various layers on the substrate, including a layer of titanium and silicon nitride $(Ti, Si_k)N_x$ or of titanium and silicon nitride doped with oxygen $(Ti, Si_k)N_xO_y$.

DETAILED DESCRIPTION OF PREFERRED EMBODIMENTS

The invention relates to a method for coloured coating on a watchmaking or jewellery structural component or an external part component, comprising at least one visible surface prepared in advance on a substrate 1.

There is meant by structural component, a functional component, fulfilling a mechanical function, such as a plate, bridge, wheel, link, closure or similar.

There is meant by external part component, a component, the function of which is more visual, in particular a display component, such as a dial, a moon, or other, or a visible component on a strap or a jewel.

It is understood that, if the method according to the invention is applicable to any watchmaking or jewellery component chosen in a compatible material, it is used preferably, but in a non-limiting manner, for some types of components, such as dials or similar.

More particularly, this method is applicable to coating of a mother-of-pearl component.

According to the invention, this method comprises at least one vacuum-deposition step of at least one main layer 3 of titanium and silicon nitride $(Ti, Si_k)N_x$ or of titanium and silicon nitride doped with oxygen $(Ti, Si_k)N_xO_y$.

Hence the coloration is produced by deposition of at least one main layer 3 which is intrinsically yellow in transmission and transparent. According to the invention, this main layer 3 is composed of a titanium and silicon nitride $(Ti, Si_k)N_x$ or of a titanium and silicon nitride doped with oxygen $(Ti, Si_k)N_xO_y$, with or without doping by other metals which, thanks to its transparency, does not counteract the visual effects of the surface below. This main layer 3 adds a yellow appearance to the original colours of the surfaces of the substrate 1, as a function of preparation of this base substrate 1: structuring, beveling, ribbing, guilloche work, or other.

It is possible to combine the iridescent sheens of the substrate 1, in particular when it is made of mother-of-pearl, the sheens of a texture, including brushing or polishing, or even interferential effects produced by deposition of additional intermediate layers 2 between the substrate 1 and the main yellow layer 3.

It will be noted that the main yellow layer 3 can also come directly as a coating of the substrate 1.

The main thin layers 3 which give a sufficiently saturated yellow appearance are located in a range of thickness of 20 nm to 2,000 nm, and are deposited on the substrate without or with a bonding layer.

In a particular, non-limiting embodiment, the main layers 3 are present as a stack in which the titanium and silicon nitride (Ti, Si$_k$)N$_x$ or the titanium and silicon nitride doped with oxygen (Ti, Si$_k$)N$_x$O$_y$, can be in a pure form or doped with other components.

In another particular non-limiting embodiment, the titanium and silicon nitride (Ti, Si$_k$)N$_x$ or the titanium and silicon nitride doped with oxygen (Ti, Si$_k$)N$_x$O$_y$ forms a monolithic layer.

One or more additional layers, intermediate 2 or upper 4, dielectric, transparent or semi-transparent, can be deposited under or on the main layer 3 of titanium-silicon nitride or of titanium-silicon nitride doped with oxygen, in order to adjust the colour in reflection and/or transmission by interferential effects.

In a particular embodiment, optimisation of the thickness of the layer is sought in order to benefit from the interferential colour in addition to the intrinsic colour of the layer.

In another particular embodiment, other additional intermediate 2 or upper 4 transparent layers are added in order to:
increase the chemical and mechanical resistance;
improve adhesion of the stack on the substrate or of the coloured layer;
optimise more the colour by interference;
give a glossy or matt appearance according to what is sought;
give an appearance of depth.

More particularly, the advantageous proportions which give good results are within the ratio range k=Si/Ti between 1.5 to 4.0, i.e. compositions of the type (TiSi$_{1.5}$)N$_x$ up to (TiSi$_4$)N$_x$ or even (Ti, Si$_{1.5}$)N$_x$O$_y$ up to (Ti, Si$_4$)N$_x$O$_y$.

The value of x or y in the formulae is not measured. The main layers 3 do not have a metallic appearance, therefore is can be concluded that they are very close to the stoichiometry at the nitrogen level. This concerns "quasi-stoichiometric" main layers.

For the extreme proportions of silicon relative to titanium, within the suitable range, the values x for the main 100% stoichiometric layers can be calculated:
for (Ti, Si$_{1.5}$)N$_x$, the maximum value of x=3.00
for (Ti, Si$_4$)N$_x$, the maximum value of x=6.33
A range of values of x=3.00 to 6.33 can thus be defined.

The tonality and the saturation of the colour are a function of the ratio k=Si/Ti and of the thickness of the layer. In order to obtain the yellow colour, the ratio k=Si/Ti is selected with a value between 1.5 and 4.0.

The thickness is chosen between 20 nm and 2,000 nm so that the yellow colour of the layer is sufficiently saturated. Possibly, the titanium and silicon nitride (Ti, Si$_k$)N$_x$ or the titanium and silicon nitride doped with oxygen (Ti, Si$_k$)N$_x$O$_y$, can be doped with other metals, for example with lithium, in order to increase the saturation of the colour.

The main layer 3 of titanium and silicon nitride (Ti, Si$_k$)N$_x$ or of titanium and silicon nitride doped with oxygen (Ti, Si$_k$)N$_x$O$_y$, can be vacuum-deposited by physical vapour phase deposition (PVD) using one of the techniques grouped together under the generic term PVD, i.e. cathodic sputtering, ion-beam sputtering, laser evaporation or ablation.

In the useful range of 20 nm to 2,000 nm, the optimum layer thicknesses are in the range of 100 nm to 300 nm, as a function of the intensity of the desired colour: the colour is all the deeper the thicker the layer.

Amongst the dopings, a doping with oxygen produces good results, despite a bias according to which it is not used in layers provided for mother-of-pearl, its suitable chemical formulation is of the type:

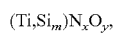(Ti,Si$_m$)N$_x$O$_y$, where m=1.5 to 4 and x>y.

In theory, all the nitrogen atoms can be substituted by oxygen atoms. After a certain concentration of oxygen, the greatly selective absorption will be lost (i.e. loss of useful coloration of the layer), which leads to the value of the coefficient y being limited, preferably between y=0 and y=2.

A bonding layer is optional and, in the particular case of a coating on the mother-of-pearl, a bonding layer does not prove to be necessary. According to the nature of the substrate 1, in the cases where a bonding layer is desired in order to improve bonding of the main layer 3 on the substrate 1, vacuum-deposition of a main layer 3 of titanium and silicon nitride (Ti, Si$_k$)N$_x$ or of titanium and silicon nitride doped with oxygen (Ti, Si$_k$)N$_x$O$_y$, can be preceded by a plasma treatment, or more particularly a plasma treatment under argon and/or oxygen, in particular under pure argon or pure oxygen.

Furthermore and still optionally, additional intermediate 2 or upper 4 layers, transparent or semi-transparent, can be deposited above and/or below the main layer of titanium and silicon nitride (Ti, Si$_k$)N$_x$ or of titanium and silicon nitride doped with oxygen (Ti, Si$_k$)N$_x$O$_y$.

An accumulation of layers is more the result of a mode of manufacture than a deliberate choice.

In a particular sequence of the method according to the invention, a cathodic sputtering (preferably) is effected, or by ion beam, metallic targets of Ti and Si (but also possible with a Ti/Si alloy target with the desired proportions), by adding reactive gases ("reactive sputtering").

Other possible methods are:
cathodic sputtering or by ion beam, of a ceramic target based on (Ti, Si$_k$)N$_x$O$_y$;
vacuum-evaporation by electron beam, by electric arc or by a Joule effect of an alloy of Ti and Si (preferably TiSi$_2$) by adding reactive gases ("reactive evaporation").

The substrate 1 can, apart from the main layer 3 of titanium and silicon nitride (Ti, Si$_k$)N$_x$ or of titanium and silicon nitride doped with oxygen (Ti, Si$_k$)N$_x$O$_y$, carry at least one additional intermediate layer 2. This additional intermediate layer 2 can have several functions. It can be used to promote bonding of the main layer 3 of titanium and silicon nitride (Ti, Si$_k$)N$_x$ or of titanium and silicon nitride doped with oxygen (Ti, Si$_k$)N$_x$O$_y$ on the substrate 1. Another function can be to adjust the colour in reflection by interferential effect. To this end, the additional intermediate layer 2 can be monolayer or formed of a stack of layers with alternating layers of low and high refractive index in order to obtain the desired interferential effect, one or more of these layers being able to be absorbent.

By way of example, a stack of SiO$_2$ layers: index of 1.46 (low) and an Si$_3$N$_4$ layer: index of 2 (high) can be used in particular. Preferably, the thicknesses of the layers for each one is chosen to be between 10 nm and 400 nm. The refractive index and the thickness of the layers makes it possible to control the interference phenomenon, i.e. the amplitude and wavelength of the constructive and/or destructive interference.

It will be noted that the main layer 3 of titanium and silicon nitride (Ti, Si$_k$)N$_x$ or of titanium and silicon nitride doped with oxygen (Ti, Si$_k$)N$_x$O$_y$, participates similarly in the stack to the other layers, according to the same laws of interference. The main layer 3 of titanium and silicon nitride (Ti, Si$_k$)N$_x$ or of titanium and silicon nitride doped with oxygen (Ti, Si$_k$)N$_x$O$_y$, can therefore be used as a part of these stacks in order to create additional interferential effects. In other words, it is possible to create (using optical simulation software) stacks with the titanium and silicon nitride (Ti, $Si_k)N_x$ or the titanium and silicon nitride doped with oxygen (Ti, $Si_k)N_xO_y$, and layers of low and high refractive index which allow optical properties which are not attainable using solely a layer of titanium and silicon nitride (Ti, $Si_k)N_x$ or of titanium and silicon nitride doped with oxygen (Ti, $Si_k)N_xO_y$.

According to the invention, the materials of the additional intermediate layer 2 are chosen from nitrides, oxynitrides, and/or silicon and/or metallic oxides and in particular from the following metals: Ti, Al, Ta, Ce, Zr, Hf.

The coating can, furthermore, comprise at least one additional upper layer 4, i.e. a layer deposited on the free surface, opposite the substrate 1 of the main layer 3 of titanium and silicon nitride (Ti, $Si_k)N_x$ or of titanium and silicon nitride doped with oxygen (Ti, $Si_k)N_xO_y$. This additional upper layer 4 can likewise fulfil one or more functions. It can have as function that of increasing the mechanical and chemical resistance of the coating, of giving a glossy or matt appearance to the coating and/or of giving an effect of depth. As in the case of the additional intermediate layer 2, it can also have as function that of adjusting the colour by interferential effect. It can be monolayer or multilayer (stack of alternate layers of $SiO_2$ and $Si_3N_4$), as described for the additional intermediate layer 2 and, likewise, be formed from nitrides and/or oxides of various materials.

According to the invention, the additional intermediate layer 2 and the additional upper layer 4 which are possible each have a thickness between 20 and 2,000 nm, the thickness being that of the monolayer if a single layer is deposited or of the multilayer in the opposite case.

In watchmaking and jewellery, the problem still arises of maintaining the colour in warm and humid environments. In order to resolve this problem, a stack of layers is proposed, in particular of $Al_2O_3$ and of titanium and silicon nitride (Ti, $Si_k)N_x$ or of titanium and silicon nitride doped with oxygen (Ti, $Si_k)N_xO_y$ with determined thicknesses, a stack which would resist discolouration in hostile environments. Hence, in order to protect the component from discolouration in a warm or/and humid environment, the additional intermediate 2, or upper 4 layer, preferably comprises a stack of aluminium $Al_2O_3$ layers alternating with at least one main layer 3 of titanium and silicon nitride (Ti, $Si_k)N_x$ or of titanium and silicon nitride doped with oxygen (Ti, $Si_k)N_xO_y$.

One particular advantageous application of this method relates to the case of such a component, the substrate 1 of which is made of mother-of-pearl.

The invention also relates to a watchmaking or jewellery external part component, comprising a mother-of-pearl substrate.

According to the invention, this component comprises at least one surface of a yellow coating above this substrate 1, and this coating comprises at least one main layer 3 of titanium and silicon nitride (Ti, $Si_k)N_x$ or of titanium and silicon nitride doped with oxygen (Ti, $Si_k)N_xO_y$, preferably according to one of the formulations explained further back.

More particularly, this substrate 1 is a dial.

The invention also relates to a watch comprising at least one such watchmaking or jewellery external part component.

The invention also relates to a jewel comprising such a watchmaking or jewellery external part component.

In total, the yellow layer deposited on the mother-of-pearl substrate according to the invention has several advantages:

The colour is yellow independently of the viewing angle.
It is possible to modulate the tonality and intensity of this colour by depositing interferential layers and by adjusting the thickness of the layer of titanium and silicon nitride (Ti, $Si_k)N_x$ or of titanium and silicon nitride doped with oxygen (Ti, $Si_k)N_xO_y$, or its composition.
The particular morphology of the mother-of-pearl is always visible after deposition.
The layer adheres well to the substrate, the adhesion also being able to be improved thanks to the plasma treatment and to the deposition of interferential layers.
The reflectance is low, comparable to that of dielectric oxides, in order to avoid the metallic appearance.
The coating is non-toxic.
The coating is stable relative to production and usage conditions of the coated article (washing, application of appliques, handling, etc.).
The coating is deposited under conditions which do not impair the substrate.
The coating is chemically stable and resistant to normal tests for internal parts in watchmaking (UV, humid heat, thermal shocks).

In conclusion, the invention based on titanium and silicon nitride (Ti, $Si_k)N_x$ or titanium and silicon nitride doped with oxygen (Ti, $Si_k)N_xO_y$ produces a layer, of yellow colouring, in a shade termed "champagne", more particularly with golden sheens, this layer is very resistant, in particular to abrasion, and is superior to all coatings known from prior art in this colouring. This layer has good transparency properties, and proves to be suitable for luxury watchmaking or jewellery creations, for protecting and showing the components under consideration to their advantage.

What is claimed is:

1. A method for coloured coating on a structural component or a watchmaking or jewellery external part component, comprising at least one visible surface prepared in advance on a substrate, said method comprising at least one vacuum-deposition step of at least one main layer of titanium and silicon nitride (Ti, $Si_k)N_x$ or of titanium and silicon nitride doped with oxygen (Ti, $Si_k)N_xO_y$, wherein
an additional intermediate layer, transparent or semi-transparent, is deposited between the substrate and the main layer, and/or
an additional upper layer is deposited on a free surface of the main layer, and
wherein said additional intermediate layer or said additional upper layer, or both, comprises a stack of aluminium $Al_2O_3$ layers alternating with at least one said main layer,
wherein
x ranges from 3.00 to 6.33,
y ranges from greater than 0.0 to 2.0, and
k is between 1.5 to 4.0.

2. The method according to claim 1, wherein said at least one main layer has a thickness between 20 nm and 2,000 nm.

3. The method according to claim 2, wherein said at least one main layer has a thickness between 30 nm and 300 nm.

4. The method according to claim 1, wherein said titanium and silicon nitride (Ti, $Si_k)N_x$ or said titanium and silicon nitride doped with oxygen (Ti, $Si_k)N_xO_y$ is also doped with lithium in order to saturate the colour.

5. The method according to claim 1, wherein the vacuum-deposition of a main layer of titanium and silicon nitride (Ti, $Si_k)N_x$ or of titanium and silicon nitride doped with oxygen (Ti, $Si_k)N_xO_y$ is preceded by a plasma treatment in order to improve the bonding of said main layer on the substrate.

6. The method according to claim 1, wherein the vacuum-deposition of a main layer is preceded by a plasma treatment under argon and/or oxygen in order to improve the bonding of said main layer on the substrate.

7. The method according to claim 1, wherein if said additional intermediate layer or said additional upper layer is not an additional intermediate layer or said additional upper layer that comprises a stack of aluminium $Al_2O_3$ layers alternating with at least one said main layer, said additional intermediate layer or said additional upper layer is formed from a single layer or from a stack of layers.

8. The method according to claim 7, in which said additional intermediate layer or said additional upper layer, or both, is formed from a stack of layers with alternating of a layer with a given refractive index and of a layer having a refractive index greater than the given index in order to create an interferential effect.

9. The method according to claim 1, wherein if said additional intermediate layer or said additional upper layer is not an additional intermediate layer or said additional upper layer that comprises a stack of aluminium $Al_2O_3$ layers alternating with at least one said main layer, said additional intermediate layer or said additional upper layer is composed of nitrides, oxynitrides and/or metallic oxides or of silicon.

10. The method according to claim 9, in which the metals of the oxides and nitrides are selected from the list consisting of titanium, tantalum, aluminium, zirconium, hafnium and cerium.

11. The method according to claim 1, the substrate is made of mother-of-pearl.

\* \* \* \* \*